(12) United States Patent (10) Patent No.: US 7,676,783 B2
Mukund et al. (45) Date of Patent: Mar. 9, 2010

(54) APPARATUS FOR PERFORMING COMPUTATIONAL TRANSFORMATIONS AS APPLIED TO IN-MEMORY PROCESSING OF STATEFUL, TRANSACTION ORIENTED SYSTEMS

(75) Inventors: Shridhar Mukund, San Jose, CA (US); Anjan Mitra, Santa Clara, CA (US)

(73) Assignee: iKoa Corporation, Menlo Park, CA (US)

( * ) Notice: Subject to any disclaimer, the term of this patent is extended or adjusted under 35 U.S.C. 154(b) by 653 days.

(21) Appl. No.: 11/426,887

(22) Filed: Jun. 27, 2006

(65) Prior Publication Data

US 2006/0294490 A1 Dec. 28, 2006

Related U.S. Application Data

(60) Provisional application No. 60/694,538, filed on Jun. 27, 2005, provisional application No. 60/694,546, filed on Jun. 27, 2005, provisional application No. 60/694,537, filed on Jun. 27, 2005.

(51) Int. Cl.
*G06F 17/50* (2006.01)
(52) U.S. Cl. .................. 716/16; 716/17; 365/230.06
(58) Field of Classification Search .............. 716/16–18
See application file for complete search history.

(56) References Cited

U.S. PATENT DOCUMENTS 5,734,921 A * 3/1998 Dapp et al. ................... 712/10
7,036,106 B1 * 4/2006 Wang et al. ................... 716/18
7,434,131 B2 * 10/2008 Mukherjee et al. .......... 714/733

\* cited by examiner

*Primary Examiner*—Jack Chiang
*Assistant Examiner*—Binh C Tat
(74) *Attorney, Agent, or Firm*—Martine Penilla & Gencarella, LLP (57) ABSTRACT

An apparatus for performing in-memory computation for stateful, transaction-oriented applications is provided. The apparatus includes a multi-level array of storage cells. The storage cells are configurable for a read access from one of a plurality of access data paths. The plurality of access data paths are also configurable for a write access from one of the plurality of access data paths. The multi-level array is capable of being configurable into logical partitions with arbitrary starting addresses. The apparatus further includes a compute element in communication with the multi-level array over the plurality of access data paths, the compute element configured to issue a plurality of memory accesses to the multi-level array through the plurality of access data paths. Methods for programming a multi-level array of storage cells and for processor design are also provided.

20 Claims, 5 Drawing Sheets

APPARATUS FOR PERFORMING COMPUTATIONAL TRANSFORMATIONS AS APPLIED TO IN-MEMORY PROCESSING OF STATEFUL, TRANSACTION ORIENTED SYSTEMS

CLAIM OF PRIORITY

The present application claims priority under 35 U.S.C. § 119(e) from U.S. Provisional Patent Application No. 60/694,538, filed Jun. 27, 2005, U.S. Provisional Patent Application No. 60/694,546, filed Jun. 27, 2005, and U.S. Provisional Patent Application No. 60/694,537, filed Jun. 27, 2005, all of which are incorporated by reference in their entirety for all purposes. The present application is related to U.S. application Ser. No. 11/426,882 entitled METHOD FOR SPECIFYING STATEFUL, TRANSACTION-ORIENTED SYSTEMS FOR FLEXIBLE MAPPING TO STRUCTURALLY CONFIGURABLE, IN-MEMORY PROCESSING SEMICONDUCTOR DEVICE, and U.S. application Ser. No. 11/426,880 entitled STRUCTURALLY FIELD-CONFIGURABLE SEMICONDUCTOR ARRAY FOR IN-MEMORY PROCESSING OF STATEFUL, TRANSACTION-ORIENTED SYSTEMS, each of which are incorporated by reference in their entirety for all purposes.

BACKGROUND

System on a chip (SOC) implementation is predominantly based on design capture at the register-transfer level using design languages such as Verilog and VHDL, followed by logic synthesis of the captured design and placement and routing of the synthesized netlist in physical design. Current efforts to improve design productivity have aimed at design capture at a higher level of abstraction, via more algorithmic/system approaches such as C++, C, SystemC and System Verilog.

As process technology advances, physical design issues such as timing closure and power consumption management have dominated the design cycle time as much as design capture and verification. Methodology advances currently in development and under consideration for adoption using higher levels of abstraction in design capture do not address these physical design issues, and manufacturability issues. It is recognized in the semiconductor industry that with process technologies at 90 nm and below, physical design issues will have even more significant cost impacts in design cycle time and product quality.

CAD tools for placement and route of synthesized logic netlists have delivered limited success in addressing the physical design requirements of deep submicron process technologies. To take full advantage of deep submicron process technology, the semiconductor industry needs a design methodology and a supporting tool suite that can improve productivity through the entire design cycle, from design capture and verification through physical design, while guaranteeing product manufacturability at the same time. It is also well-known in the semiconductor industry that SOC implementations of stateful, transaction-oriented applications depend heavily on on-chip memory bandwidth and capacity for performance and power savings. Placement and routing of a large number of memory modules becomes another major bottleneck in SOC physical design.

Another important requirement for an advanced SOC design methodology for deep submicron process technology is to allow integration of on-chip memory with significant bandwidth and capacity without impacting product development schedule or product manufacturability. High level design capture, product manufacturability, and support for significant memory resources are also motivating factors in the development of processor-in-memory. Processor-in-memory architectures are driven by requirements to support advanced software programming concepts such as virtual memory, global memory, dynamic resource allocation, and dynamic load balancing. The hardware and software complexity and costs of these architectures are justified by the requirement to deliver good performance for a wide range of software applications. Due to these overheads, multiple processor-in-memory chips are required in any practical system to meet realistic performance and capacity requirements, as witnessed by the absence of any to system product development incorporating a single processor-in-memory chip package.

There is thus an added requirement for cost effective SOC applications that resource management in processor-in-memory architectures be completely controllable by the designer through program structuring and annotations, and compile-time analysis. It is also important to eliminate all cost and performance overheads in software and hardware complexity attributed to the support of hierarchical memory systems. Based on these observations, there is a need in the semiconductor industry for a cost-effective methodology to implementing SOCs for stateful, transaction-oriented applications.

SUMMARY

Broadly speaking, the present invention fills these needs by providing a method and apparatus for performing in-memory computation for stateful, transaction-oriented applications. It should be appreciated that the present invention can be implemented in numerous ways, including as a process, an apparatus, a system, or a device. Several inventive embodiments of the present invention are described below.

In one embodiment, an apparatus for performing in-memory computation for stateful, transaction-oriented applications is provided. The apparatus includes a multi-level array of storage cells. The storage cells are configurable for a read access from one of a plurality of access data paths. The plurality of access data paths are also configurable for a write access from one of the plurality of access data paths. The multi-level array is capable of being configurable into logical partitions with arbitrary starting addresses. The apparatus further includes a compute element in communication with the multi-level array over the plurality of access data paths, the compute element configured to issue a plurality of memory accesses to the multi-level array through the plurality of access data paths.

In another embodiment, a method for programming a multi-level array of storage cells functioning as a computational apparatus is provided. The method includes partitioning a memory space of the multi-level array at compile-time into run-time partitions functioning as stack memory, code memory, state memory, output buffers, queues and extension memories. The memory space lacks a virtual memory and a cache hierarchy. Temporary variables are stored in a stack having a fixed size that is known at compile time. An instruction set and the extension memory is programmed in an application instance dependent fashion.

In yet another embodiment, a method for processor design where the processor has a multi-level array of storage cells is provided. The method includes defining fixed length instructions and extending the fixed length instruction using an extension table residing in an independent memory unit of the multi-level array. The independent memory unit is addressable by an index provided in a primary instruction.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

DETAILED DESCRIPTION

An invention is described for a structurally reconfigurable intelligent memory device for efficient implementation of stateful, transaction-oriented systems in silicon. It will be obvious, however, to one skilled in the art, that the present invention may be practiced without some or all of these specific details. In other instances, well known process operations have not been described in detail in order not to unnecessarily obscure the present invention.

The embodiments of the present invention described below provide a method and apparatus enabling flexible design capture methodology which allows a designer to select the granularity at which a stateful, transaction-oriented application is captured. An efficient methodology to implement a stateful, transaction-oriented application on a platform economically superior with respect to design effort, implementation costs and manufacturability is further described below. The embodiments utilize an execution model that allows for efficient compiler optimization and resource allocation, efficient hardware implementation, and accurate performance analysis and prediction when a design is captured and analyzed. It should be appreciated that no significant uncertainty is introduced by design compilation, mapping into the physical platform, or resource conflicts during system operation. The resource requirements are specified explicitly when the design is captured, using annotations or compiler analysis. Allocation of hardware resources can be determined statically at compile time.

In another aspect of the invention a simple and effective chip architecture that uses a single level real memory organization to eliminate the costs of managing a caching hierarchy associated with virtual memory systems in applications development, compiler optimization, run-time system support, and hardware complexity is provided. As will be explained in more detail below, the embodiments described herein meet the tremendous demands of memory capacity and bandwidth in future generation SOCs with solutions that are economical in die area, product development cycle and power consumption. At the same time, the embodiments reap the cost, performance and power consumption benefits of advanced deep submicron fabrication processes with exceedingly high manufacturability and reliability.

Figure 1:
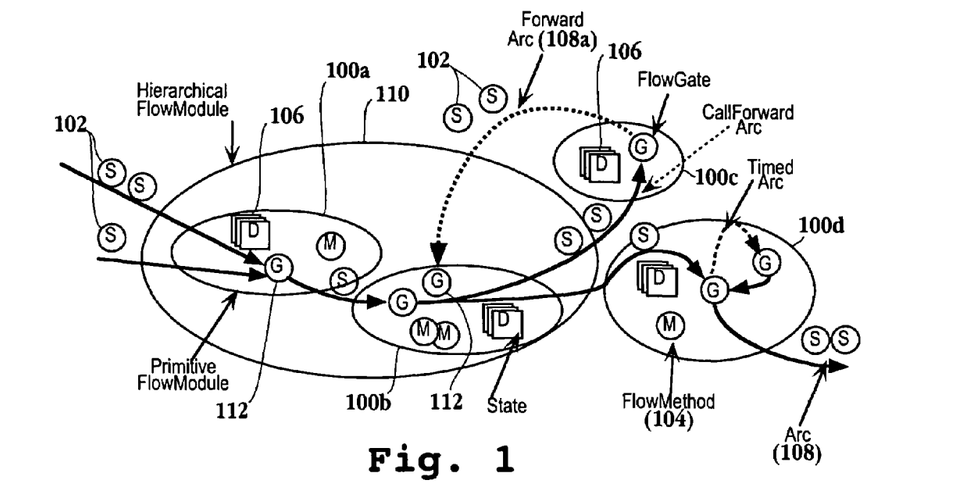
FIG. 1 is a high-level simplified schematic diagram of flow modules in accordance with one embodiment of the invention.

FIG. 1 is a high-level simplified schematic diagram of FlowModules in accordance with one embodiment of the invention. FlowModules 100a through 100d represent objects in accordance with one embodiment of the invention. FlowModules 100a through 100d are mostly comprised of memory arrays in this embodiment. FlowModule 100a includes FlowMethod 104, States 106, and FlowGate 112. Signals 102 are processed and commuted between FlowModules through FlowGates 112. Signals 102, which may be referred to as messages, are in packet format in one embodiment of the invention. The primary inputs and outputs into the FlowLogic architecture are also Signals. Arc 108 represents a channel through which data flows between FlowGates 112. In one embodiment, Arcs 108 represent queues and Signals 102 are transmitted through Arcs 108. FlowModules 100 represent objects, defining codes and data allocated to memory. FIG. 1 further illustrates FlowModule 100a and FlowModule 100b within hierarchical FlowModule 110. FlowModule 100a and FlowModule 100b are grouped within hierarchical FlowModule 100 for convenience in one embodiment. In other words, the grouping of FlowModule 100a and FlowModule 100b may be analogized to an alias. Arcs 108 may be characterized as a ForwardArc 108a, a CallForwardArc 108b or a TimedArc 108c in one embodiment. The details for these types of Arcs are provided below. It should be appreciated that Arcs 108 are created in application-specific fashion. FlowGates 112 are invoked through an external Signal and are akin to a function call.

Still referring to FIG. 1, PrimitiveFlowModules, henceforth referred as FlowModules 100a-d, are concurrent entities that include FlowGates 112, States 106, and FlowMethods 104. Arcs 108 emanate from a FlowGate and terminate at a FlowGate. An Arc can carry one or more Signals at a given time. A FlowGate is invoked by a Signal instance, i.e., a Signal instance is targeted to invoke a specific FlowGate. In one embodiment, a Signal instance is a stream of bytes that carries necessary arguments which may be a small message or a large packet or of any size in between. A Signal also may carry a priority-class attribute. Signals within a class (priority-class) are guaranteed to arrive in the order they were generated at the head of the Arc. It should be appreciated that FlowGate 112 does not have a state of its own. FlowGate 112 can modify the state of the FlowModule it resides in and the FlowGates may generate one or more Signals and thereby invoke one or more FlowGates concurrently. In one embodiment, FlowGate 112 may be thought of as an indivisible and un-interruptible sequence of procedural code that typically terminates after a short burst of execution. FlowLogic guarantees that one and only one FlowGate within a FlowModule is active at any time and a FlowGate once started is guaranteed to complete. FlowMethods, as used herein, are sequential bodies of code, e.g., C style function calls that the Flow-Gates within a FlowModule may use to achieve their end goals. Hierarchical FlowModules comprise one or more FlowModules 100a-d, and are largely used to facilitate Flow-Logic code reuse and interface specification exchange. A TimedArc is a special case of an Arc, where the constituent Signals carry a Timer. The constituent Signals in a TimedArc will invoke corresponding FlowGate out-of-order as and when the Timer expires. In one embodiment, TimedArcs are specifically constrained to originate and terminate within the same FlowModule. A ForwardArc is another special case of an Arc 108 whose destination is implied by Signals carried by a CallForwardArc. It should be appreciated that the notion of threads or processors does not exist in the FlowLogic description. FlowLogic can be thought of as a set of interacting pipelines of Signal flows.

One skilled in the art will appreciate from FIG. 1 that the FlowLogic architecture can be used to describe an arbitrary transaction-oriented application using an arbitrary number of interconnected FlowLogic components. Isochronous systems can also be described with reasonable timing resolution. It should be noted that FlowLogic is not meant for traditional digital logic system design where cycle accuracy and deterministic behavior is paramount. Systems designed using FlowLogic are non-deterministic, but can have well-known end-to-end functional behavior independent of the delays in the Arc. Arcs are guaranteed not to drop Signals unless they are attributed specifically to do so. The quantitative or performance behavior of the system may change depending on the parameters of the Arcs, including delay (latency), capacity, priority and so forth.

The FlowLogic architecture allows flexible design space exploration of performance and quantitative behavior, followed by flexible mapping of the results into the said structurally field-configurable semiconductor device. The parameters related to Arcs 108, among others, are determined interactively during system simulations using FlowLogic. It may be noted that the performance behavior of such systems will only be as good as the traffic pattern assumptions made in the simulation. In one embodiment, FlowGates referred to as DynamicFlowGates can be dynamically loaded and linked at run-time. In one embodiment, DynamicFlowGates are limited to serving the purposes of run-time system diagnostics and debug. Thus, an overview of the FlowLogic system and language has been provided above and further details are provided with reference to the Figures referenced below.

Figure 2:
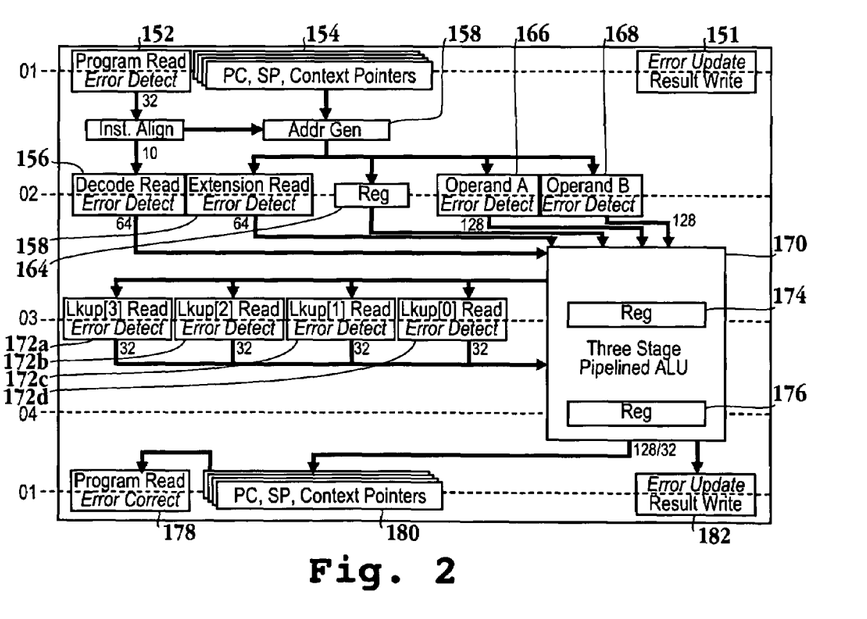
FIG. 2 is a simplified schematic diagram illustrating the data path of a Compute element of a FlowTile in accordance with one embodiment of the invention.

FIG. 2 is a simplified schematic diagram illustrating the data path of a Compute element of a FlowTile in accordance with one embodiment of the invention. FIG. 2 may be thought of as illustrating the processing portion of an arithmetic logic unit (ALU) of the processor for a FlowTile. In this exemplary embodiment, the FlowTile includes four virtual processors, i.e., four stages of the pipeline therefore four threads are illustrated with FIG. 2. However, one skilled in the art will appreciate that any number of processors and threads may be linked as the invention is not limited to four virtual processors. Thus, on the left-hand side of FIG. 2, the numerals 01, 02, 03, 04 and 01 represent stages for a time element within the processing stage. Within the first stage an instruction-read is performed, as illustrated by blocks 152, 154 and 151. The read is performed and an error detection is executed. The instructions are aligned through block 156 and addresses are generated through block 158. These addresses from block 158 are provided for memory accesses and used as data in blocks 162, 164, 166 and 168 of stage 2. In stage 2, the decode is performed and an extension read is also executed as illustrated through blocks 160 and 162, respectively. The operands are delivered to a three-stage pipeline ALU 170. As illustrated, operand A 166 and operand B 168 are delivered to ALU 170, which includes registers 174 and 176, after error detection has been performed. In stage 3, the look-up functionality is performed. Here, one or more of the operands to the ALU 170 may be taken and used as address bits into four memories. The data may then be read out of the corresponding look-up tables 172a through 172d. The cycle will then repeat as illustrated by blocks 178, 180, and 182. It should be appreciated that the architecture within the processing piece of the ALU 150 is a memory centric processor. Each of the memories of modules 152, 151, 160, 162, 166, 168, 172a through 172d can be shared. Thus, the amount of memory allocated to each one of the above-mentioned modules can be changed. That is, the memory allocated to the modules is configurable and there are many access paths into the multiple level arrays of memory storage elements, as opposed to traditional processors, where there are a few access paths to fixed size memories. In addition, the memory references represented by modules 152, 151, 160, 162, 166, 168, 172a through 172d are unique in that traditional processor architecture does not incorporate these features via multiple independent access paths.

In one embodiment of the present invention, Compute element 150 of FIG. 2 is adapted for efficient implementation of the functionality of the FlowModule. Unlike traditional processors, a plurality of memory access paths is an integral part of Compute element 150. The Compute logic gates and registers are robustly designed to minimize sub-threshold leakage arising from static complementary metal oxide semiconductor (CMOS) structures as further illustrated with reference to U.S. application Ser. No. 11/426,880. The physical extent of combinational logic and registers is minimized and speed matched to work efficiently within the surrounding fabric of configurable memories. In one embodiment, the data path is split into four phases running up to four independent and concurrent virtual processors. As mentioned above, the invention is not limited to four virtual processors, as any suitable number of virtual processors may be incorporated. These virtual processors are in a sense similar to hyper threads, however, the memory resources used by them are completely disjoint, hence the term virtual processors. FIG. 2 depicts the entire data path of Compute element 150 as there are no caching hierarchies, virtual memories or shared memories typically present in prior art processors or multi-processors. In one embodiment, the virtual processors may be associated with separate partitions of the multi-level memory. Alternatively, the virtual processors may share some overlapping portions of the multi-level memory array. In one embodiment, one of the virtual processors will handle system functionality, such as scheduling, exception handling, credit sharing, network functions, etc. The memory access paths, which may also be referred to as access data paths, include the following:

Program Read 152: The control code is read from the stored program control memory. The instruction size is fixed to be 32 bits wide in one embodiment. There is an instance of a program counter for each one of the virtual processors and some portion of the instruction is used to identify the operands and operand selection mode. The instruction is aligned and operand addresses are generated. Compute element 150 depends extensively on context pointers for generating relative addresses. The address offsets in the instruction itself have a dynamic range in accordance with the size of the bit field each occupies.

Decode Read 160: This is the micro-program read that decodes the program code into control states for controlling the computation operation. In a sense, the architecture of Compute element 150 defies the principles of Reduced Instruction Set Computer (RISC) design by resorting back to microprogram based control. The microprogram decode is programmable, in that certain instances of Compute element 150 may have application dependent optimizations of the microprogram control store.

Extension Read 162: This field is used to customize a control instruction in the second step or pipeline stage. In particular, extension read 162 generates operand masks as required for bit manipulations, in the context of transaction-oriented processing. Typically, the extension reads are templates that are generated on an application specific basis and are referenced by the primary instructions.

Operand A&B Read 166 and 168, respectively: The two operands are read from the addresses generated by the address generator 158.

Look Up[0-3] 172a-d: There are four optional lookup memory partitions that enable a special class of instructions called the "Memory Extensible Instructions." These instructions are application dependent and hence the look up memories can be optionally configured for each Compute element 150. These instructions accelerate algorithms such as encryption, authentication, hashing, cyclic redundancy checks and multiplication among others, used in transaction-oriented applications. The operands are used to generate the addresses for the four lookup partitions and the resulting four lookup outputs, up to 128 bits each, are combined together in ALU 170 to generate the output.

Result Write 182: The resulting output from ALU 170 is then written into the corresponding memory partition via the access path of result write 182.

ALU 170: Often times the result of ALU 170 is used to update an internal register or the next control state of the program. It should be noted that there is no branch prediction or any other form of instruction-level-parallelism enhancement techniques. The architecture of Compute element 150 once again defies the premise of RISC. Compute element 150 does have several complex instructions operating on anywhere from 32 to 128 bit data paths, which are optimized for stateful, transaction-oriented applications. ALU 170 is a three stage pipelined unit in one embodiment. As shown in FIG. 2, two of those stages are shared with memory accesses. The instruction set is described later with reference to FIG. 7.

The embodiments of the present invention are particularly designed to address noise-induced errors and soft-errors plaguing deep semiconductor memory technologies. Noise sources include crosstalk and coupling. In a reasonably designed system, soft-errors are rare, but inevitable. Compute element 150 detects single-bit errors on all the read access paths 152 and 178, but does not expend combinational logic in correcting the error. Compute element 150 is designed to go into an exception mode, where the error is corrected programmatically at the cost of compute cycles. In a sense, this is similar to a hardware interrupt. In fact, Compute element 150 does not have any other forms or use of interrupts in the embodiments described herein. In the embodiment described herein data is organized in bytes each with its own parity bit enabling error detection at the byte level. Furthermore, a block of 16 bytes including the parity bits is protected by a 9-bit syndrome enabling single-bit error correction at the block level.

Figure 3:
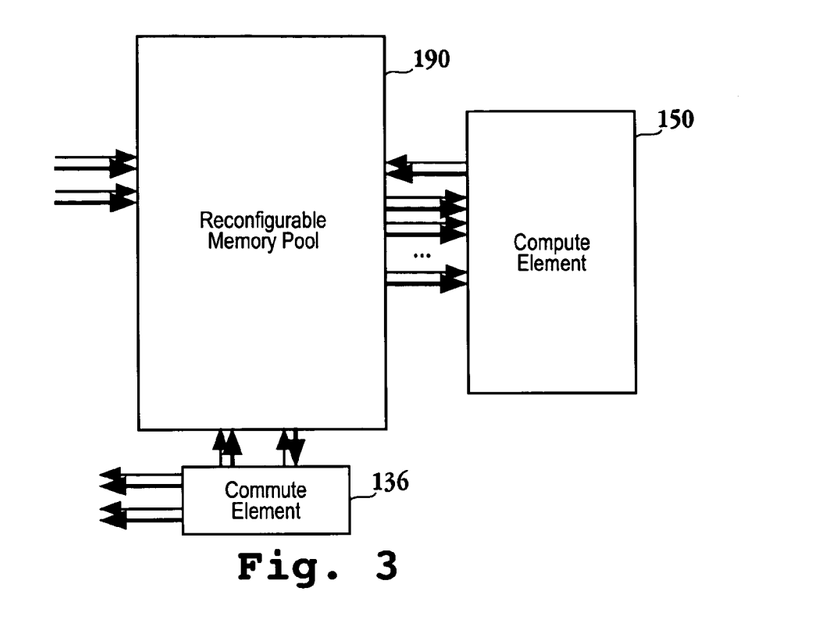
FIG. 3 is a simplified schematic diagram illustrating the relationship between the memory partitions, the Compute element of FIG. 2 and a Commute element in accordance with one embodiment of the invention.

FIG. 3 is a simplified schematic diagram illustrating the relationship between the memory partitions and the Compute element of FIGS. 2 and 3 and the Commute element of FIG. 3 in accordance with one embodiment of the invention. As illustrated, Compute element 150 has a reconfigurable memory pool 190, which is also in communication with Commute element 136. It should be appreciated that Compute element 150, reconfigurable memory pool 190, and Commute element 136 may also be referred to as a FlowTile. Reconfigurable memory pool 190 represents a pool of structurally configurable memory elements providing access paths to the Compute element 150. In one embodiment, memory elements, access paths and Compute element 150 are bit-aligned and pitch matched. These elements are field configured in an application specific fashion to suit each instance of the Compute element 150. Commute element 136 and Compute element 150 are associated with corresponding portions of memory pool 190 and those portions may be reconfigured.

Built-In Silicon Test & Repair: A Substantial part of the semiconductor device includes the configurable memory pools. Since other elements do not occupy a significant percentage of the device die, they are designed robustly with respect to potential manufacturing defects. Memory pool 190 is tested in-silicon and configured to eliminate defective portions of the memory units in an application independent fashion. In one embodiment, much of this operation is performed programmatically on power up. The memory pools are then configured appropriately to suit a given application. The memory pool also provides independent read accesses to a resident Commute element and independent write accesses to neighboring Commute elements. As mentioned above, Commute elements 136 of FIG. 3 are responsible for commuting Signals from one portion of the device to another.

Figure 4:
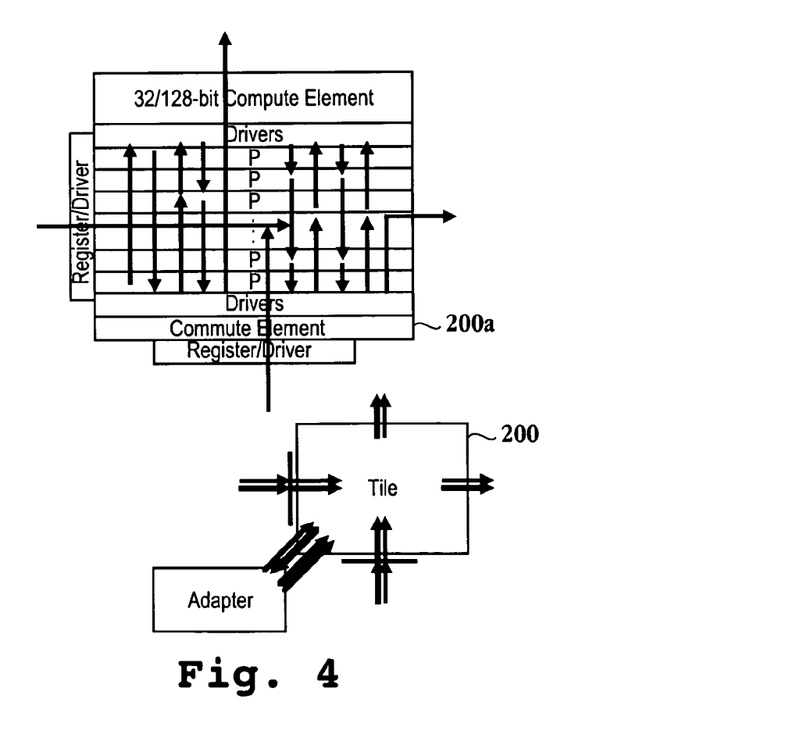
FIG. 4 further illustrates the topological position of a Compute element of FIGS. 2 and 3 and the Commute Element of FIG. 3 in the context of a structurally configurable in-memory processing array in accordance with one embodiment of the invention.

FIG. 4 further illustrates the topological position of a Compute element of FIGS. 2 and 3 and the Commute Element of FIG. 3 in the context of a structurally configurable in-memory processing array in accordance with one embodiment of the invention. FIG. 4 shows an elemental FlowTile 200 of the device. As can be seen in more detail in FlowTile 200a, there is an arrangement of configurable access paths to pages (P) of memory over the memory array with Compute element 170 embedded in a pitch-matched fashion.

Figure 5:
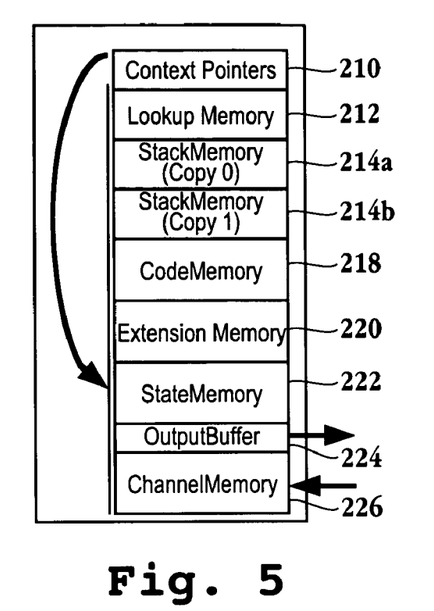
FIG. 5 illustrates the architectural model of the Compute element in accordance with one embodiment of the invention.

FIG. 5 illustrates the architectural model of the Compute element in accordance with one embodiment of the invention. As shown, Context Pointers 210 are included since most processing required by the FlowLogic architecture is object-oriented and is relative to a small dynamic range of addressing. Context Pointers 210 point to several configurable size memory partitions as described below in more detail:

LookupMemory 212: This partition of memory is optional and can use 1, 2 or 4 of the access paths shown earlier. The contents of LookupMemory 212 are programmed typically at configuration time as required by the application. Portions of lookup memory 212 can also be metal-programmed during manufacturing.

Figure 6:
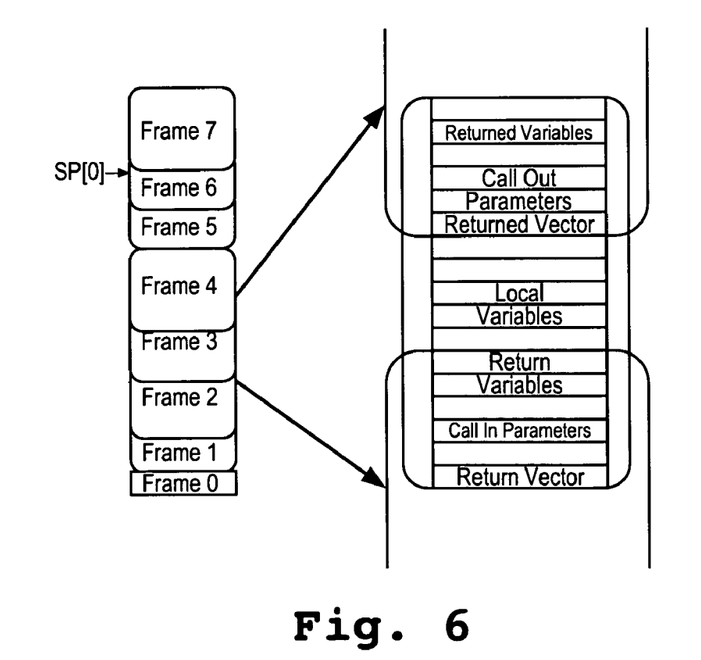
FIG. 6 is a simplified schematic illustrating an exemplary StackMemory in accordance with one embodiment of the invention.

StackMemory (Copy 0 and 1) 214a and 214b, respectively: The execution model of the Compute element can be analogized to a stack machine. The Compute element does not have the notion of register files or virtual memories. All the required memory is pre-allocated at the compile or personalization time in one embodiment. StackMemory 214a and 214b serves as temporary storage of run-time state of the FlowGate. FlowGates in FlowLogic are so specified that the maximum Stack size required for an application can be determined at compile time. The partition is made sufficiently large to house the deepest stack as determined by the compiler. FlowLogic does not support the notion of recursive function calls to ensure that the Stack does not overflow in one embodiment. FIG. 6 illustrates usage of the Stack Memory as the FlowGate is executing and making nested function calls therein.

There is an optional second copy of the StackMemory which is a mirror image of the original copy. This arrangement is used in one embodiment to make the contents of the Stack available as either operand to the ALU. The two copies of the StackMemory however get written into simultaneously. The compiler in some cases may choose not to use the second copy. But often times, Stack Memories are substantially smaller, but the variables stored in the Stack tend to get used frequently. It should be appreciated that the StackMemory is the replacement for register files in traditional RISC processors.

CodeMemory 218: Much of the program code relates to FlowGates, which are relocatable and contextual. The CodeMemory partition can be configured to any arbitrary size like other partitions. Multiple virtual processors can share some of the code as required. Portions of CodeMemory 218, especially those relating to power on repair can be metal-programmed at the time of device manufacture. The rest of the application dependent code is typically programmed at the configuration time in one embodiment. In some special cases, such as exception handling, this partition can also be programmed at run-time in an exception specific way.

ExtensionMemory 220: This is a much smaller optional partition that is used to customize instances of instruction, typically providing masks and alignments and other control/data parameters to the ALU.

StateMemory 222: This is a memory partition where the FlowModule states are stored and operated upon. All the allocations into state memory 222 are made at the compile time. As mentioned previously, there is no dynamic heap storage allocation or garbage collection in FlowLogic.

Output Buffer 224: This is a relatively small partition, where the Compute element writes to, but does not read from. The Commute element typically reads out from this partition.

Channel Memory 226: This is typically a flexible partition which may be very small in some cases and large in others. Signals are deposited into this partition by the Commute element. The Compute element only has read access to this partition.

FIG. 6 is a simplified schematic illustrating an exemplary StackMemory in accordance with one embodiment of the invention. As explained earlier, the threads executing FlowGates do not have a state of their own at any point in time. A FlowGate and its nested FlowMethod calls use the Stack Memory as the code is running. As a result the Stack grows. The FlowLogic compiler ensures that the Stack will never grow beyond its pre-allocated size in any case.

Figure 7:
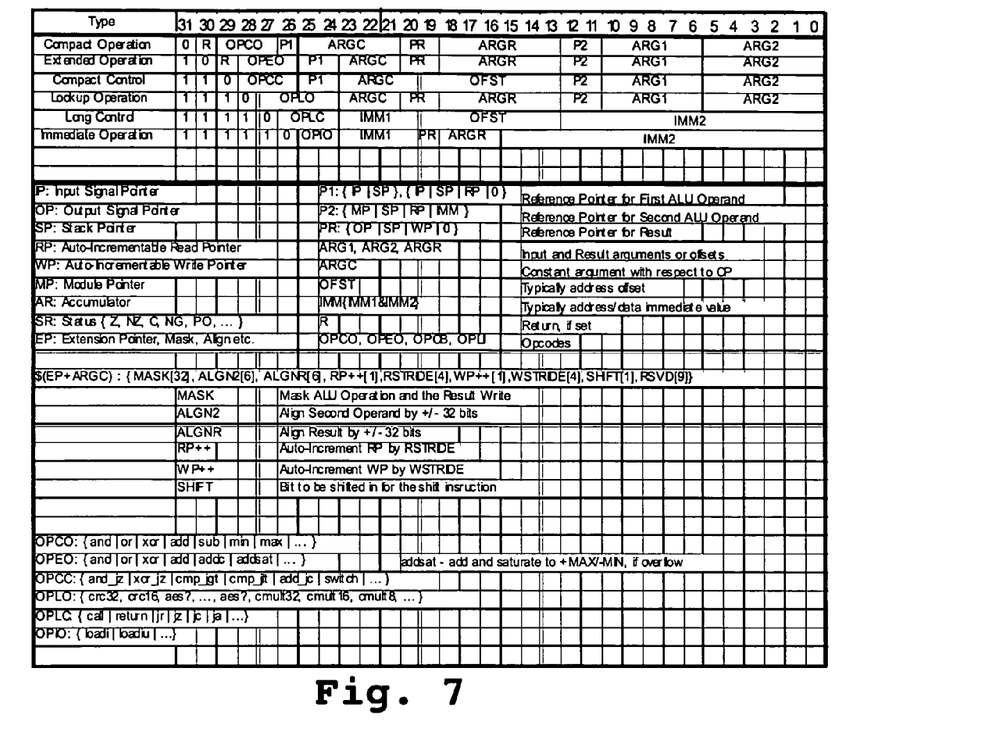
FIG. 7 illustrates the instruction set architecture of the Compute element in accordance with one embodiment of the invention.

FIG. 7 illustrates the instruction set architecture of the Compute element in accordance with one embodiment of the invention. It should be noted that in the preferred embodiment the instruction set is programmable, in such a fashion that the instruction set can be made compact for a given instance of application. One skilled in the art will notice that the Compute element depends on domain specific pointers to minimize the dynamic range of the operand addresses for most frequently used instructions. For less frequently used instruction however, a much larger dynamic range is feasible at the cost of multiple instructions to perform a particular operation. The Extension pointer and the corresponding programmable extension provide a richer context to instructions in terms of alignment, shift and masking. The extensions tend to be a small set and application specific.

Figure 8:
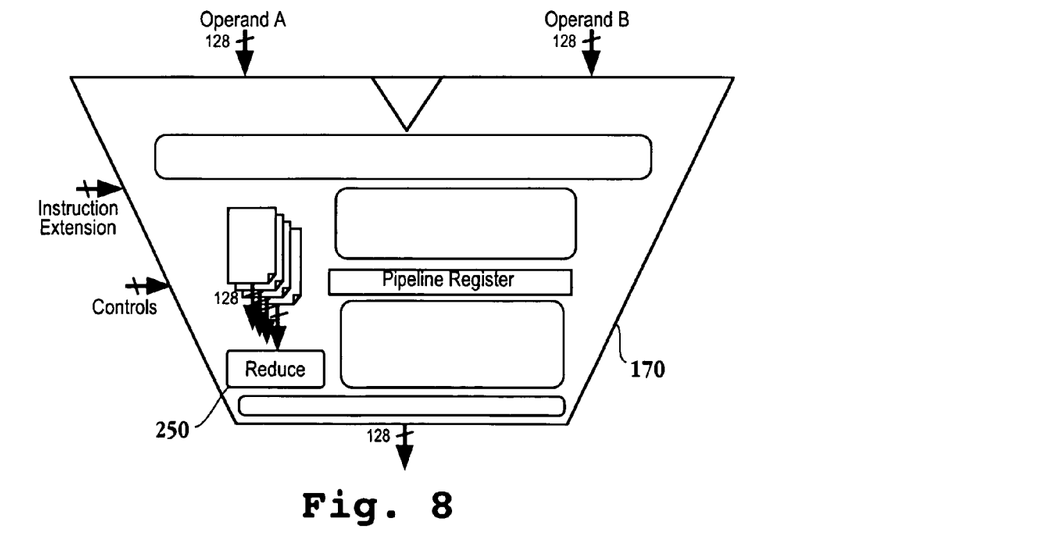
FIG. 8 further illustrates the memory extensible instructions as an extension to the arithmetic logic unit (ALU) in accordance with one embodiment of the invention.

The concept of memory extensible instruction is disclosed by the embodiments described herein. FIG. 8 further illustrates the memory extensible instructions as an extension to the ALU in accordance with one embodiment of the invention. ALU 170 itself is pipelined. Along side the pipeline stage is the optional data path through four instances of LookupMemories. The addresses to these LookupMemories are generated directly from one or more of the operands. These memory partitions output 128 bits each which are then combined in Reduce combinational logic block 250. The contents of the lookup tables are themselves programmable and the reduction algorithm is selected by programming the instruction set appropriately. The reduction operations range from bitwise exclusive-OR, swizzle, and 4-way carry-save combine among others. Some of the useful operations include primitives for generating single cycle hash function, polynomial division as used in cyclic-redundancy check, Advanced Encryption Standard (AES) encryption, authentication etc.

Figure 9:
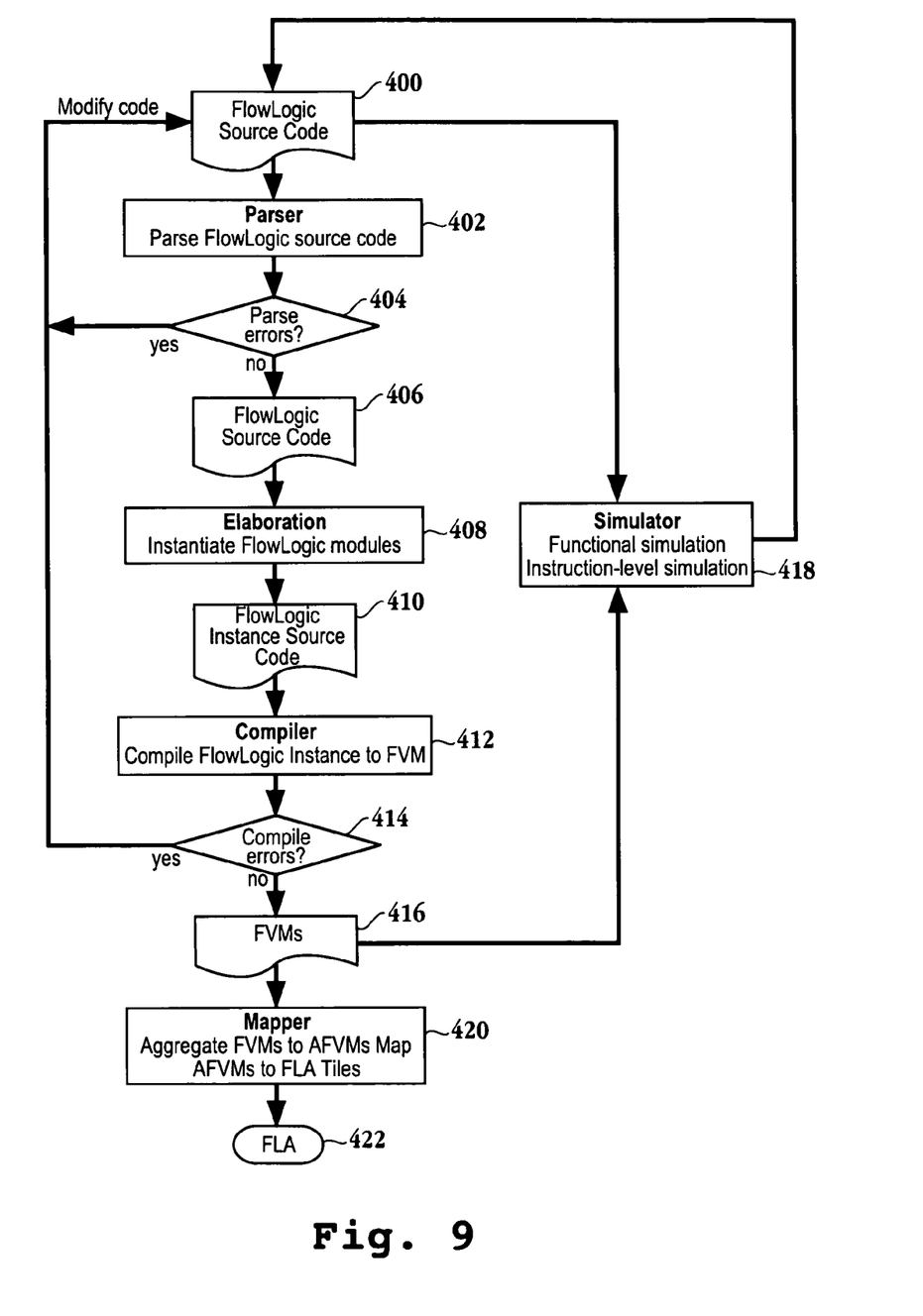
FIG. 9 is a flowchart diagram illustrating the method operations for configuring and programming a semiconductor circuit device having a multiple level array of memory storage cells in accordance with one embodiment of the invention.

FIG. 9 is a flowchart diagram illustrating the method operations for configuring and programming a semiconductor circuit device having a multiple level array of memory storage cells in accordance with one embodiment of the invention. The method initiates with operation 400 where the initial FlowLogic source code is provided. In operation 402, the FlowLogic source code is parsed. In decision operation 404, it is determined whether any errors exist in the source code, e.g., syntax errors. Since FlowLogic supports a subset of C++ in one embodiment, it should be appreciated that this check will reveal any syntax issues. If an error does exist, the method returns to operation 400 and the error is corrected and the method resumes as described above. If there is no error detected, then the method advances to operation 406 where the FlowLogic source code is in a state where some of the code is in a C++ format. In operation 408, the Flowlogic modules are instantiated through an elaboration process. Here, the source code having a description of a network is converted to code representing FlowLogic instances, i.e., a network of instances is provided. This results in the FlowLogic Instance source code as represented in operation 410.

Still referring to FIG. 9, in operation 412, the FlowLogic Instances are compiled into corresponding FVMs. The compiled FVMs are checked for compile errors in operation 414. If there are compile errors found in operation 414, then the method returns to operation 400 and repeats as described above. If there are no compile errors, then the compiled FVMs are made available in operation 416. The compiled FVMs are input into a simulator in operation 418, wherein a functional simulation and an instruction level simulation are performed. It should be appreciated that the source code from operation 400 is used to provide the function level simulation, while the compiled FVMs are used to provide the instructional level simulation. In operation 420, a mapper aggregates the FVMs to AFVMs and maps AFVMs to FLA (FlowLogicArray) Tiles. Here, the mapping of the AFVM is into a portion of the multiple level array of memory storage cells. Additionally, the multi-way access paths of the multiple level array are configured according to the multiple FVMs in operation 420. Thereafter, the portion of the multiple level array is programmed to function according to the multiple FVMs. The method terminates in operation 422 where the FLA (FlowLogicArray) is defined as a chip in silicon.

The embodiments described above provide a memory centric approach for a processing system design and architecture, as well as the FlowLogic language for designing, synthesizing, and placing and routing techniques for this unique processing system design. Terms of the FlowLogic language have been analogized to some object oriented terms for ease of understanding. For example, a FlowGate may be thought of as a Function, Procedure or Task, while a FlowModule may be analogized to an object in object oriented programming. A Signal may be referred to as a message or a packet. It should be appreciated that while these analogies are used for explanatory purposes, there are significant differences between the embodiments described herein and the corresponding analogies.

Traditional processors incorporate the notion of virtual memories to push physical memory away from the processing core. To do so, they introduce accumulators, registers and caching hierarchies. The embodiments described above embrace the incorporation of processing core(s) directly within the physical memory. Furthermore, the data paths in the above-described embodiments are significantly different than the data paths within the traditional processor architecture.

The invention has been described herein in terms of several exemplary embodiments. Other embodiments of the invention will be apparent to those skilled in the art from consideration of the specification and practice of the invention. The embodiments and preferred features described above should be considered exemplary, with the invention being defined by the appended claims.

With the above embodiments in mind, it should be understood that the invention may employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

Any of the operations described herein that form part of the invention are useful machine operations. The invention also relates to a device or an apparatus for performing these operations. The apparatus may be specially constructed for the required purposes, or it may be a general purpose computer selectively activated or configured by a computer program stored in the computer. In particular, various general purpose machines may be used with computer programs written in accordance with the teachings herein, or it may be more convenient to construct a more specialized apparatus to perform the required operations.

The invention can also be embodied as computer readable code on a computer readable medium. The computer readable medium is any data storage device that can store data which can be thereafter be read by a computer system. Examples of the computer readable medium include hard drives, network attached storage (NAS), read-only memory, random-access memory, CD-ROMs, CD-Rs, CD-RWs, magnetic tapes, electromagnetic wave carriers, and other optical and non-optical data storage devices. The computer readable medium can also be distributed over a network coupled computer systems so that the computer readable code is stored and executed in a distributed fashion.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims. In the claims, elements and/or steps do not imply any particular order of operation, unless explicitly stated in the claims.

What is claimed is:

1. An apparatus for performing in-memory computation for stateful, transaction-oriented applications, the said apparatus comprising:
    a multi-level array of storage cells, the storage cells configurable for a read access from one of a plurality of access data paths, the plurality of access data paths being configurable for a write access from one of the plurality of access data paths, the multi-level array being configurable into logical partitions with arbitrary starting addresses;
    a compute element in communication with the multi-level array over the plurality of access data paths, the compute element configured to issue a plurality of memory accesses to the multi-level array through the plurality of access data paths; and
    a pre-decode stage, the pre-decode stage including, a control store code memory having a fixed instruction length program code, the instruction length program code read from the control store and pre-decoded for generating opcode, extension address and operand offsets, wherein the operand offsets are summed with a plurality of architectural pointer registers to generate physical addresses for a subsequent operations.

2. The apparatus of claim 1, wherein the control store code memory has a flexible depth realized by configuration into the multi-level array.

3. The apparatus of claim 1, further comprising:
    a decode and fetch stage, the decode and fetch stage including,
        a decode store having decoded controls, the decode store having a flexible depth realized by configuration into the multi-level array of storage cells;
        an extension store having instruction extension parameters, the extension store having a flexible depth realized by configuration into the multi-level array of storage cells;
        an operand store having compute element accessible data, messages and states, the operand store having further partitions realized by configuration into the multi-level array of storage cells.

4. The apparatus of claim 3, wherein within the decode and fetch stage a decode read operation generates controls required for a transformation operation, an operand fetch operation generates operands, and an extension read operation generates controls that include mask and alignment controls as required by a specific instance of an application.

5. The apparatus of claim 1, further comprising:
    an arithmetic logic unit (ALU) computation stage, the ALU computation stage including multiple width arithmetic and logical operations, an update stage for update of architectural registers including a program counter and stack pointer and for update of a result into operand partitions of the memory.

6. The apparatus of claim 5, wherein the ALU computation stage employs configurable memory lookup paths.

7. The apparatus of claim 6, wherein the ALU computation stage includes at least one pipeline stage performing a lookup memory access operation into a plurality of memory partitions having flexible depths realized by configuration into the multi-level array, wherein an address of the lookup memory access operation is defined by one or more input operands to the ALU computation stage.

8. The apparatus of claim 1, wherein Soft-Error detection and correction is achieved through detecting a single-bit error using a byte-wise parity code and wherein the single-bit error is corrected using a 128-bit block two-dimensional parity code, which reuses the byte-wise parity code.

9. The apparatus of claim 8, wherein a subset of bytes of the 128 bit block and an error-syndrome are updated via read-modify-write, without having to read a remainder of bytes in the 128-bit block.

10. The apparatus of claim 8, wherein the single-bit error is detected on a plurality of read access paths simultaneously via the byte-wise parity code.

11. The apparatus of claim 8, wherein the single-bit error is corrected by redundantly mirroring data and selecting a half that does not have a parity error.

12. The apparatus of claim 8, wherein upon detecting an error a first virtual processor of the compute element is frozen and the error is restored offline using a second virtual processor.

13. The apparatus of claim 1 wherein portions of the multi-level array that are identified as defective are configured out of a functional space before assigning working portions to partitions.

14. The apparatus of claim 1, wherein configuration and contents of the storage cells is factory programmed using a single-mask at the time of manufacture.

15. The apparatus of claim 1, wherein access to the storage cells in the multi-level array is provided through independent and asynchronous clocks.

16. The apparatus of claim 1, wherein the sub-threshold leakage power is minimized through use of dynamic memory and dynamic logic for access paths.

17. The apparatus of claim 1, wherein the multi-level array includes one of dual ported memory units or single ported memory units having time-multiplexed access.

18. The apparatus of claim 1, wherein the compute element is virtualized into multiple virtual processors having separate and independent architectural register sets.

19. The apparatus of claim 18, wherein each virtual processor is associated with a corresponding portion of the multi-level array of storage cells and wherein corresponding portions of the multi-level array may overlap.

20. The apparatus of claim 1, wherein the multi-level array of storage cells, the plurality of access data paths, and the compute element are bit sliced and pitch matched.

* * * * *